(12) United States Patent
Kobuke et al.

(10) Patent No.: US 9,538,645 B2
(45) Date of Patent: Jan. 3, 2017

(54) MULTILAYER WIRING SUBSTRATE

(71) Applicant: EPCOS AG, Munich (DE)

(72) Inventors: Hisashi Kobuke, Tokyo (JP); Yousuke Futamata, Tokyo (JP); Emi Ninomiya, Tokyo (JP)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 14/889,385

(22) PCT Filed: May 27, 2014

(86) PCT No.: PCT/EP2014/060976
§ 371 (c)(1),
(2) Date: Nov. 5, 2015

(87) PCT Pub. No.: WO2014/191421
PCT Pub. Date: Dec. 4, 2014

(65) Prior Publication Data
US 2016/0088729 A1 Mar. 24, 2016

(30) Foreign Application Priority Data

May 31, 2013 (JP) .................................. 2013-115818

(51) Int. Cl.
*H05K 1/09* (2006.01)
*H05K 1/03* (2006.01)
(Continued)

(52) U.S. Cl.
CPC ............. *H05K 1/0306* (2013.01); *C03C 12/00* (2013.01); *H05K 1/0298* (2013.01); *H05K 1/09* (2013.01);
(Continued)

(58) Field of Classification Search
CPC ............... H05K 2201/0242; H05K 2201/0245; H05K 2201/0266; H05K 2201/0269; H05K 1/0306; H05K 2201/0248; H05K 3/46; H05K 2201/0251
See application file for complete search history.

(56) References Cited

U.S. PATENT DOCUMENTS 4,784,893 A * 11/1988 Nishimoto ................ B32B 7/02
428/901
5,527,604 A * 6/1996 Hayashi ................ H01L 23/142
428/323
(Continued)

FOREIGN PATENT DOCUMENTS

EP 2168928 A1 3/2010
EP 2200409 A1 6/2010
(Continued)

*Primary Examiner* — Chau N Nguyen
*Assistant Examiner* — Roshn Varghese
(74) *Attorney, Agent, or Firm* — Slater Matsil, LLP

(57) ABSTRACT

A multilayer wiring substrate includes a number of insulating layers, each insulating layer including a glass ceramic. A number of internal conductor layers are formed between the insulating layers. Via conductors penetrate through the insulating layers and mutually connect the internal conductor layers in different layer locations. Surface conductor layers are formed on an outer surfaces in a lamination direction of the insulating layers. The insulating layers include outside insulating layers and inside insulating layers. A first aspect ratio representing an oblateness and sphericity of an external filler contained in the outside insulating layers is larger than a second aspect ratio representing an oblateness and sphericity of an internal filler contained in the inside insulating layers. A thermal expansion coefficient of the outside insulating layers is smaller than a thermal expansion coefficient of the inside insulating layers.

16 Claims, 6 Drawing Sheets

(51) Int. Cl.
*H05K 1/00* (2006.01)
*H05K 3/46* (2006.01)
*C03C 12/00* (2006.01)
*H05K 1/02* (2006.01)
*H05K 1/11* (2006.01)

(52) U.S. Cl.
CPC ............ *H05K 1/115* (2013.01); *H05K 3/4629* (2013.01); *H05K 3/4617* (2013.01); *H05K 2201/0209* (2013.01); *H05K 2201/0266* (2013.01)

(56) References Cited

U.S. PATENT DOCUMENTS

| | | | |
|---|---|---|---|
| 7,602,051 B2 * | 10/2009 | Ito | C08K 7/00 428/209 |
| 2004/0096634 A1 * | 5/2004 | Taga | H01L 23/15 428/210 |
| 2009/0039477 A1 * | 2/2009 | Kaga | C04B 35/584 257/655 |
| 2009/0117357 A1 * | 5/2009 | Cho | B32B 18/00 428/213 |
| 2009/0296364 A1 * | 12/2009 | Yamamoto | H01L 21/563 174/250 |
| 2010/0080981 A1 | 4/2010 | Kobuke et al. | |
| 2010/0151217 A1 * | 6/2010 | Kanada | H01L 23/15 428/217 |
| 2013/0233599 A1 * | 9/2013 | Kim | H01L 23/3735 174/255 |

FOREIGN PATENT DOCUMENTS

| | | |
|---|---|---|
| JP | 200526722 A | 1/2005 |
| JP | 2007103836 A | 4/2007 |
| JP | 2010100517 A | 5/2010 |

* cited by examiner

MULTILAYER WIRING SUBSTRATE

This patent application is a national phase filing under section 371 of PCT/EP2014/060976, filed May 27, 2014, which claims the priority of Japanese patent application 2013-115818, filed May 31, 2013, each of which is incorporated herein by reference in its entirety.

TECHNICAL FIELD

The present invention relates to a multilayer wiring substrate comprising a glass ceramic sintered body having an internal conductor layer, and relates to a multilayer wiring substrate which can, for example, be employed as various types of module substrate or as a semiconductor element accommodating package or the like.

BACKGROUND

In recent years there has been a demand for electronic components used in mobile telephones, wireless LANs and the like, to be made compact and low-profile in order to cope with increasing levels of functionality and reductions in equipment size. In particular with regard to making components low-profile, there is a demand for the material to be used in these components to be a high-strength material capable of being made thin. With regard also to size reductions, high functionality within a confined area has been achieved by mounting ICs and the like directly on a multi-layer wiring substrate consisting of glass ceramic or the like. For the mounting of ICs flip-chip-mountings and the like are becoming widely used, from the viewpoint of minimizing the mounting area when ICs are mounted in this way.

In such flip chip mounting, high dimensional accuracy and surface flatness are required more than before for the surface of the multilayer wiring substrate, which is serves as a mounting surface, in order to cope with market trends to reduce the size of the ICs and increase the number of pins.

For multilayer wiring substrates provided with integrated LSIs and various types of electronic components, ceramics or glass ceramics are used as materials in order to meet demands such as those described above and also from the viewpoint of ensuring reliability. Alumina is typically used as the ceramic material. Glass ceramic materials are produced by being by mixing a glass material and a ceramic material known as an aggregate and then by sintering.

Alumina generally has advantages such as high strength and excellent heat resistance, and it thus occupies a large proportion of the ceramics used for the abovementioned multilayer wiring substrates. However, on the other hand, it also has drawbacks in that its dielectric constant is large, and it is therefore likely to cause delays in signal transmission. Moreover, alumina has a high sintering temperature of 1500° C. or more, and thus tungsten (W) or molybdenum (Mo), which have a high melting point and high electrical resistivity, must be used for wiring in the inner layers, and there are thus problems in that the electrical resistance becomes large if the wiring is made extremely fine.

On the other hand, glass ceramic materials have advantages that resolve the problems arising with alumina. Glass ceramic materials are being used more widely in consideration of its advantages of the dielectric constant being low, and further of allowing the use of low-resistance metal materials having a low melting point, such as Cu, Ag or Ag—Pd, as inner layer conductors or surface conductors, or for via conductors to connect the above two conductors.

In general, with glass ceramic multilayer wiring substrates employing glass ceramics it is straightforward to implement inter-layer circuits having a three-dimensional structure, and they thus provide good design flexibility. This is thus becoming a critical technology in the marketplace for high-frequency components, the size of which is reducing while the level of functionality is increasing.

Further, for multilayer wiring substrates having a three-dimensional structure, deformations such as warping and unevenness are likely to occur during the manufacturing process due to the three-dimensional structure. In particular, in areas in the vicinity of connection terminals formed by surface conductors on the surface of a multilayer wiring substrate during flip chip mounting of ICs, a flat surface condition is desirable in order to achieve satisfactory mounting with the IC. If an irregularity is larger than the height of the flip-chip pad on the IC, there is a high probability of mounting failure. Further, it is thought that the cause of such deformation is due to discrepancies between the sintering behaviors of the inner layer conductors or via conductors and the glass ceramic material, and thus matching the sintering behaviors of via conductors and the glass ceramic material is, in particular, a critical technology.

In particular, because via conductors are formed in a direction perpendicular to the substrate surface, the flatness of the substrate surface tends to deteriorate as the ratio between the length of the via conductors, in a direction perpendicular to the surface of the wiring substrate, and the thickness of the substrate increases. Naturally, when via conductors which extend in a direction perpendicular to the surface are connected by direct connection, the flatness of the substrate surface deteriorates more as the total length of the via conductors increases. From the viewpoint of increasing the degree of design freedom, it is desirable for via conductors to be connected together directly, and it is thus critical for the sintering behavior of via conductors to be matched.

Further, in some cases via conductors are used not only for electrical wiring but also as a heat conduction path for dissipating heat from ICs. In such cases it is common for the via conductors to be constructed in such a way that they penetrate through the multilayer wiring substrate, and they thus serve to allow heat generated when the IC is operating to escape to the outside through the via conductors. Forming such penetrating via conductors is likely to make the impact of via conductors be felt more readily, and to make deformation more likely to occur. However, in the current situation in which ICs are required to have good heat dissipation characteristics, there is an increasing demand for such structures, and thus controlling the sintering behavior of via conductors and glass ceramics is becoming critical.

With glass ceramic materials, a synergistic effect typically acts during sintering through the combination of a glass material and a ceramic material, and thus the properties of the resulting ceramic multilayer wiring substrate (dielectric constant, loss characteristics, thermal expansion coefficient, sintering temperature, bending strength and the like) can be controlled. Therefore, it is a technological challenge to find the optimal combination and to achieve a stable composition and a structure such that uniform properties can be exhibited at all times.

Further, multilayer wiring substrates employing glass ceramic materials contain glass as a main component, and they thus have the characteristic that they are sensitive to impacts and a crack is easily caused. To overcome this drawback, attempts have been made to improve the strength by formulating ceramic fillers.

Investigations into improvements of each of the problems discussed hereinabove are being made, but in order to realize a multilayer wiring substrate that is exceptionally useful in practice, a significant point to consider is how to solve all of the problems simultaneously.

For example, from the viewpoint of substrate strength, Japanese Patent Kokai 2007-103836 proposes using a tabular alumina filler in order to improve the strength of a glass ceramic multilayer wiring substrate, but adequate substrate strength is not obtained. Accordingly, Japanese Patent Kokai 2010-100517 (U.S. counterpart is published as US 2010/0080981) proposes providing a high-strength multilayer wiring substrate in which the orientation of a ceramic filler is improved by formulating a ceramic filler having a large aspect ratio.

Further, in general it is difficult to obtain a high degree of dimensional accuracy in multilayer wiring substrates produced by sintering, due to variations in the amount of shrinkage during sintering. As a countermeasure to this, it has been proposed to use a sintering technique known as a non-shrink sintering technique in which sintering shrinkage is suppressed.

Further, with multilayer wiring substrates which are sintered using a typical sintering technique, it is known that undulations are likely to occur on the substrate surface, causing a deterioration in the flatness of the multilayer wiring substrate surface, due to the effects of the sintering behavior of inner layer conductors comprising low-resistance metal materials having a low melting point, such as Cu, Ag or Ag—Pd. It has also been proposed to use a sintering technique known as a non-shrink sintering technique, in which sintering shrinkage is suppressed, as one countermeasure to these problems.

For example, Japanese Patent Kokai 2005-26722 proposes a multilayer glass ceramic substrate having improved flatness and dimensional accuracy, employing non-shrink sintering.

Non-shrink sintering techniques have also been confirmed to be effective in suppressing warping of the substrate during sintering, and they are thus being used as very effective techniques for producing multilayer wiring substrates which are required to be low-profile and increased in size.

More specifically, non-shrink sintering techniques predominantly employ a method in which shrinkage in the x-y directions is suppressed by joining a soluble green sheet (shrinkage-suppressing green sheet) of a sintering-resistant material that does not sinter at the sintering temperature of the glass ceramic substrate wiring material to one surface or both surfaces of an unsintered glass ceramic laminated body.

In a processing method employing such a non-shrink sintering technique, in a glass ceramic multilayer wiring substrate manufactured by laminating a plurality of glass ceramic green sheets, multiple via holes are formed in order to connect the inter-layer circuits electrically and the interior of the via holes is filled with an electrically conductive electrode material.

At this time, the via holes consist of electrically conductive metal powder, organic binder and solvent, and thus the volume thereof shrinks during the course of the sintering. The electrically conductive metal powder is designed such that it shrinks to the same extent as the glass ceramic, but with non-shrink sintering the shrinkage-suppressing effect of the shrinkage-suppressing green sheet with respect to the electrically conductive metal powder is poor, and the sintering behavior is likely to differ from that of the glass ceramic. Various types of electrically conductive metal powder have been investigated to deal with this situation, but this remains one problem of non-shrink sintering technology.

In general, with glass ceramics, although shrinkage in the x-y directions is suppressed by means of the soluble green sheet made of a sintering-resistant material, in contrast, shrinkage in the z direction increases. Therefore, in non-shrink sintering, there is a large difference in shrinkage of the glass ceramic compared with the electrically conductive metal in the via hole portions. As a result, after sintering, the via conductors (the via hole portions filled with the electrically conductive metal) are likely to be higher than the height of the glass ceramic, and are likely to protrude to the outside, and, thus, the substrate is likely to become deformed. The degree of deformation tends to increase as the proportion occupied by via conductors increases. Various types of improvements have been considered to deal with this situation. When non-shrink sintering is employed in this way, it becomes more difficult than with ordinary sintering to match the shrinkage behavior of the via conductors, and thus controlling the shrinkage behavior is critical.

As electronic products become more low-profile in their height, there is a need for the glass ceramic substrates used in multilayer wiring substrates to be made even thinner. Further, as circuits become more complicated and finer, the structure of the electrodes is becoming more complicated, and thus an increasing amount of stress also acts on the glass ceramic substrate. Moreover, as mounted components such as ICs become yet more compact, even greater accuracy in alignment for mounting is required, and as a result there is a need for yet further improvements in the dimensional accuracy of multilayer wiring substrates, which serves as a mounting body. Also, in relation to IC mounting, flip chip mounting is becoming more prevalent, and thus multilayer wiring substrates are facing increasing demands in regard to warping and surface flatness. There is thus a demand for a multilayer wiring substrate which has greater strength than the prior art, while having better dimensional accuracy, no warping, and excellent surface flatness.

However, the inventors have found through investigations that in relation to glass ceramic multilayer wiring substrates such as those proposed in the above mentioned Japanese Patent Kokai 2007-103836 and Japanese Patent Kokai 2010-100517, although strength and dimensional accuracy are adequate, the substrate is not satisfactory in terms of warping and surface flatness.

Further, Japanese Patent Kokai 2005-26722 proposes a multilayer glass ceramic substrate with reduced warping of the substrate and improved dimensional accuracy, but a sufficiently high substrate strength cannot be anticipated. Further, even though warping of the substrate can be improved using Japanese Patent Kokai 2005-26722, it is difficult to improve the flatness of the surface using non-shrink sintering techniques alone. This is because when non-shrink sintering techniques are applied to multilayer wiring substrates having via conductors, it is more difficult to match the shrinkage behavior of the via conductors than when ordinary sintering is employed.

SUMMARY

The present invention takes account of this situation, and embodiments provide a glass ceramic multilayer wiring substrate which has sufficiently good strength, even though it is thin, and with which surface flatness can be improved even in a multilayer wiring substrate having via conductors.

In order to achieve the abovementioned object, the glass ceramic multilayer wiring substrate according to the present invention is a glass ceramic multilayer wiring substrate having a plurality of insulating layers comprising glass ceramic. A plurality of internal conductor layers are formed between the insulating layers. Via conductors penetrate through the insulating layers and mutually connect the internal conductor layers existing in different layer locations. Surface conductor layers are formed on at least one outer surface of the insulating layers in a lamination direction of the insulating layers. If the insulating layers within a range of a predetermined thickness from the outer surface on which the surface conductor layer is formed are defined as outside insulating layers and the insulating layers located inward of said outside insulating layers are defined as inside insulating layers, a first aspect ratio representing an oblateness and sphericity of an external filler contained in the outside insulating layers is larger than a second aspect ratio representing an oblateness and sphericity of an internal filler contained in the inside insulating layers. A thermal expansion coefficient of the outside insulating layers is smaller than a thermal expansion coefficient of the inside insulating layers.

With the present invention, by making the thermal expansion coefficient of the outside insulating layers (within a range from room temperature to the sintering temperature; the same applies hereinafter) smaller than the thermal expansion coefficient of the inside insulating layers, a multilayer wiring substrate having high strength can be achieved. The reason for this is that by making the thermal expansion coefficient of the outside insulating layers smaller than that of the inside insulating layers, a compressive stress acts on the surface in the cooling process during substrate sintering, resulting in an effect whereby the strength is increased.

Further, making a first aspect ratio representing an oblateness and sphericity of an external filler contained in the outside insulating layers larger than a second aspect ratio representing an oblateness and sphericity of an internal filler contained in the inside insulating layers also results in an effect whereby the strength is increased. The outside insulating layers are the portions most susceptible to external stress, and by increasing the first aspect ratio of the outer layer filler contained in these portions, the degree of oblateness of the filler increases, and cracks originating in the outside insulating layers are less likely to occur. The inventors assume that as a result, even if the substrate is thin, the propagation of cracks to the interior of the substrate is effectively suppressed, and that at the same time this is a factor contributing to an improvement in strength.

Further, in the present invention, by employing internal filler having a small aspect ratio, the flatness of the outer surface on which a surface conductor layer is formed can be improved, even in the case of a multilayer wiring substrate having via conductors.

It should be noted that if a filler having a high aspect ratio is used in the glass ceramic forming the inside insulating layers, the filler becomes oriented in a direction parallel to the sheet surface during manufacture of the green sheet, as a result of which the shrinkage in the sheet lamination direction (a direction perpendicular to the sheet surface) during sintering increases, thereby increasing the difference in shrinkage compared with that of the electrically conductive metal powder used in the wiring. In particular, with substrates with embedded via electrodes, the impact of this is that undulations on the substrate surface tend to become larger, and thus by using for the ceramic filler an irregularly shaped filler or a spherical filler having a low aspect ratio an outer surface having excellent flatness can be achieved. By ensuring the flatness of the outer surface of the substrate, it becomes straightforward to adjust positioning relative to the substrate in order to mount ICs and the like.

Preferably, the proportion of the total thickness of the outside insulating layers is 5 to 20% of the total thickness of the multilayer wiring substrate. If the proportion of the total thickness of the outside insulating layers containing filler having a relatively large aspect ratio is too small compared with the total thickness of the substrate, the effect of improving the strength of the substrate tends to decrease, and if it is too large, the flatness of the outer surface tends to deteriorate.

It should be noted that if outside insulating layers are formed respectively on both sides in the direction of lamination, the total thickness of the outside insulating layers means the total of the thicknesses of these outside insulating layers. It should be noted that if outside insulating layers exist only on one side in the direction of lamination, the total thickness means the total thickness of the outside insulating layers on said one side. The total thickness of the multilayer wiring substrate is the thickness in the direction of lamination of the laminated body comprising insulating layers and internal conductor layers.

In the present invention, particularly when a via conductor ratio, defined as a value obtained by dividing the length of the longest via conductor in the direction of thickness in the multilayer wiring substrate by the total thickness of the multilayer wiring substrate, is equal to or greater than 0.4, the effect is particularly large. Conventionally, with multilayer wiring substrates in which the via conductor ratio is equal to or greater than 0.4, it was difficult with the prior art to achieve simultaneously both an improvement in the strength of the substrate and an improvement in the flatness of the outer surface. Because the present invention has the configuration discussed hereinabove it is possible to achieve both of these simultaneously.

Preferably, the second aspect ratio is equal to or less than 2. To elaborate, it is preferable to use as the internal filler in the glass ceramic constituting the inside insulating layers one that has a small aspect ratio. Further, the specific shape of the filler is not particularly restricted, but a spherical or irregularly shaped filler can be used.

Preferably, the first aspect ratio is equal to or greater than 25. To elaborate, by increasing the first aspect ratio of the outer layer filler, the degree of oblateness of the filler increases, and cracks originating in the outside insulating layers are less likely to occur. The inventors assume that as a result, even if the substrate is thin, the propagation of cracks to the interior of the substrate is effectively suppressed, and that at the same time this is a factor contributing to an improvement in strength.

Preferably, the external filler consists of alumina. It is preferable to configure the outer layer filler using alumina because it is thus straightforward to achieve a filler having a relatively large aspect ratio, and in addition it is easy to increase the modulus of elasticity of the outside insulating layers, an effect of suppressing warping of the substrate can also be anticipated, the toughness in terms of the material of the filler alone is high, and the generation and propagation of cracks can be easily suppressed.

Preferably, the mean particle size of the external filler is larger than the mean particle size of the internal filler. If the mean particle size of the internal filler is too large there is a danger that the via conductors or the internal conductor layers will be adversely affected. By making the mean particle size of the external filler larger than the mean particle size of the internal filler, the effects of improving the strength of the substrate and of improving the degree of flatness of the outer surface of the substrate are increased.

Preferably, it is desirable for the glass composition within the glass ceramics forming the outside insulating layers and the inside insulating layers to be the same, thereby making it less likely that defects and the like will occur due to inconsistencies in sintering behavior and diffusional reactions, and making it possible to reduce the number of factors contributing to deformation of the substrate surface.

According to the present invention it is possible to provide a glass ceramic multilayer wiring substrate the surface of which has excellent flatness, which has a high substrate strength and which is suitable to be made thin. A glass ceramic multilayer wiring substrate is also provided which has stable mounting properties when ICs and various types of functional components are mounted on the substrate by flip-chip mounting or the like, and further a glass ceramic multilayer wiring substrate is provided which can be manufactured in a stable manner.

DETAILED DESCRIPTION OF ILLUSTRATIVE EMBODIMENTS

Figure 1:
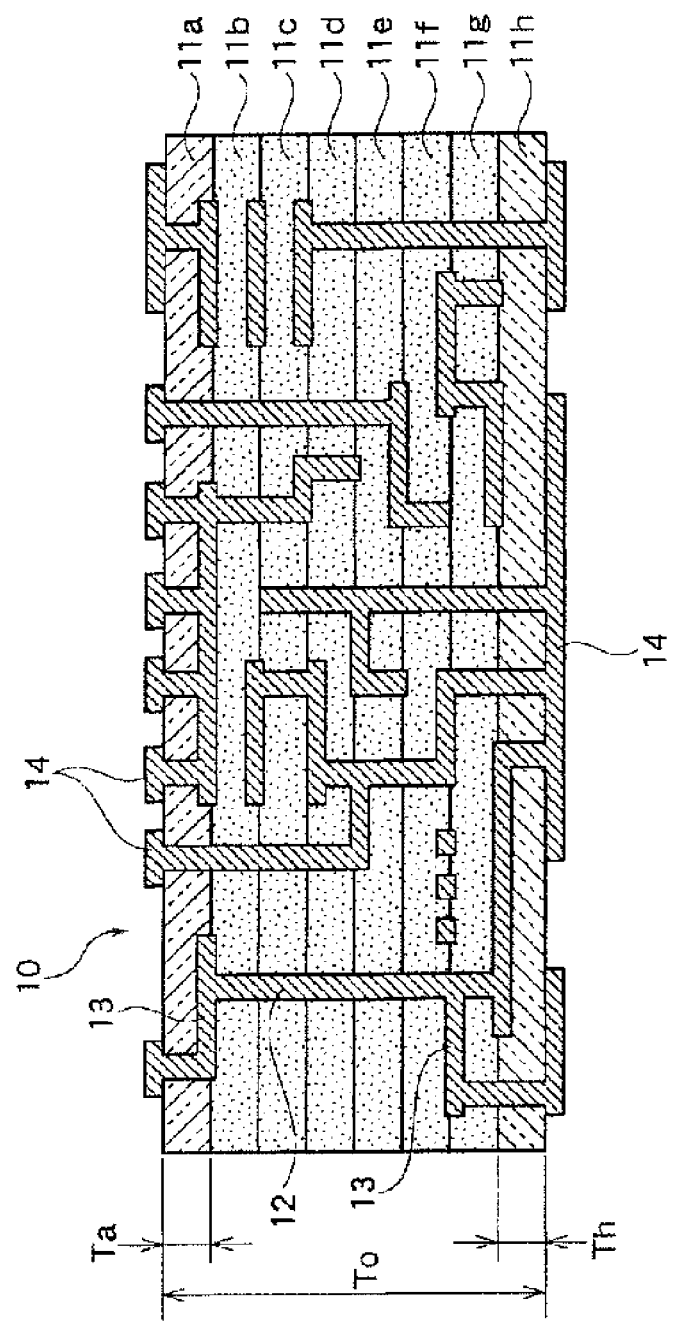
FIG. 1 is a schematic cross-sectional view of a glass ceramic multilayer wiring substrate according to a mode of embodiment of the present invention.

The present invention will now be described based on a mode of embodiment illustrated in the drawings.

FIG. 1 is a schematic cross-sectional view of a glass ceramic multilayer wiring substrate according to the present mode of embodiment. FIG. 1 illustrates a cross section in the vicinity of the center of one of the basic structures constituting a circuit, which are disposed with a desired pitch within the substrate. It should be noted that the same applies for FIG. 2, FIG. 5A to FIG. 5D and FIG. 7.

As illustrated in FIG. 1, a glass ceramic multilayer wiring substrate 10 has a laminated construction in which insulating layers 11a to 11h consisting of glass ceramic are laminated in this order. Further, the glass ceramic multilayer wiring substrate 10 has internal conductor layers 13 provided in a predetermined pattern between pairs of the insulating layers 11a to 11h that are adjacent in the vertical direction in FIG. 1, and surface conductor layers 14 provided on the outer surfaces of outside insulating layers 11a, 11h, which are the outermost layers. Further, the glass ceramic multilayer wiring substrate 10 has via conductors 12 which penetrate through the insulating layers 11a to 11h and which mutually connect internal conductor layers 13 existing in different layer locations, or connect a surface conductor layer 14 with an internal conductor layer 13.

Figure 2:
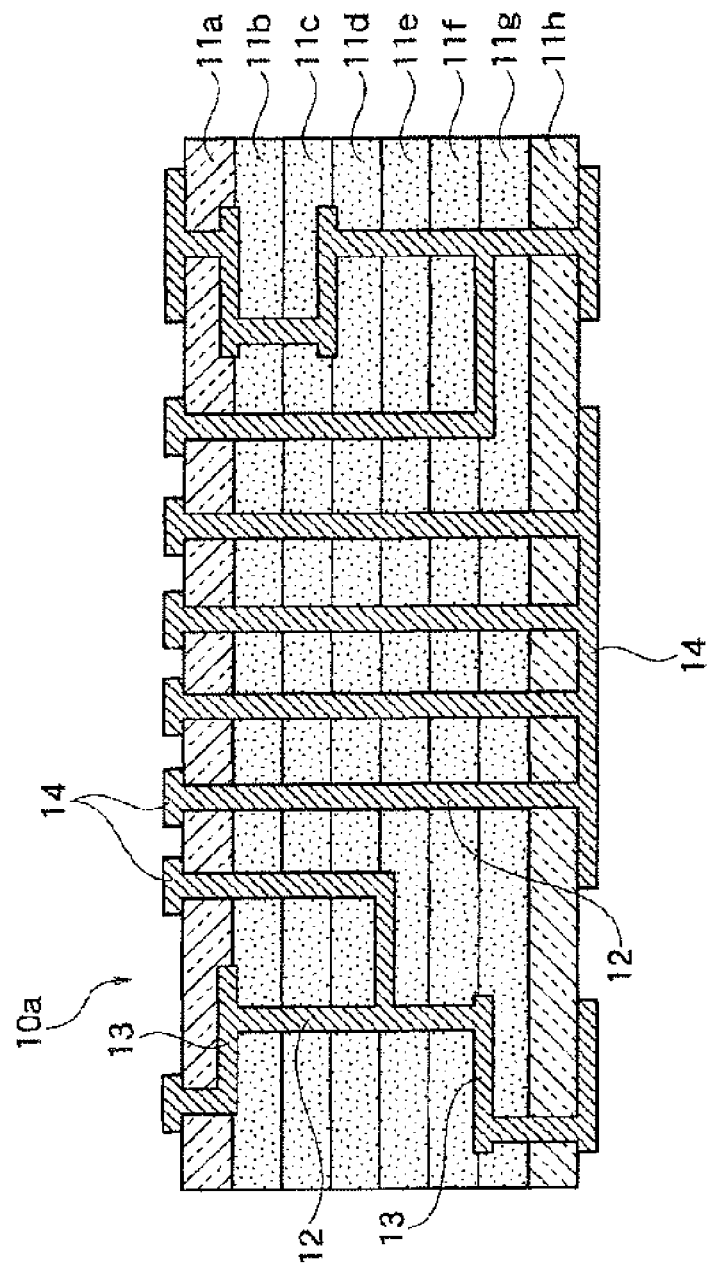
FIG. 2 is a schematic cross-sectional view of a glass ceramic multilayer wiring substrate according to another mode of embodiment of the present invention.

It should be noted that in the glass ceramic multilayer wiring substrate 10 in the mode of embodiment illustrated in FIG. 1, the via conductors 12 mutually connect internal conductor layers 13 existing in different layer locations, or connect a surface conductor layer 14 with an internal conductor layer 13, but the present invention is not limited to this. For example, as illustrated in FIG. 2, the glass ceramic multilayer wiring substrate 10a may have via conductors 12 which directly connect together surface conductor layers 14 provided respectively on the outer surfaces of outside insulating layers 11a, 11h, which are the outermost layers. It should be noted that in the drawings, common reference codes are assigned to common members, and descriptions thereof are partially omitted.

The insulating layers 11a to 11h illustrated in FIG. 1 and FIG. 2 may be obtained by sintering a single green sheet, discussed hereinafter, or they may be obtained by sintering a laminated body comprising a plurality of green sheets. Further, the number of laminations of insulating layers 11a to 11h is not limited to that in the mode of embodiment illustrated in the drawings.

In the present mode of embodiment, different fillers are contained in the glass ceramics constituting the outside insulating layers 11a, 11h, which are the outermost layers from among the laminated plurality of insulating layers 11a to 11h, and the glass ceramics constituting the inside insulating layers 11b to 11g which are disposed to the inside thereof. To elaborate, an external filler contained in the glass ceramics constituting the outside insulating layers 11a and 11h, and an internal filler contained in the glass ceramics constituting the inside insulating layers 11b to 11g have at least different aspect ratios, representing the oblateness and sphericity of the filler. In other words, a first aspect ratio A1 representing the oblateness and sphericity of the external filler contained in the outside insulating layers 11a, 11h is larger than a second aspect ratio A2 representing the oblateness and sphericity of the internal filler contained in the inside insulating layers 11b to 11g.

The glass ceramics constituting the outside insulating layers 11a, 11h each contain glass and a tabular alumina filler which is dispersed in said glass. The tabular alumina filler content is preferably 17.5 to 27.5% by volume relative to the total amount of glass and tabular alumina filler, and more preferably 20 to 25% by volume. Further, the inside insulating layers 11b to 11g consisting of glass ceramic contain glass and a spherical or irregularly shaped ceramic filler which is dispersed in said glass. The spherical or irregularly shaped ceramic filler content is preferably 25 to 35% by volume relative to the total amount of glass and alumina filler, and more preferably 27.5 to 32.5% by volume. Each component will now be described in detail.

The external filler will now be discussed. There is no particular restriction to the external filler contained in the glass ceramics constituting the outside insulating layers 11a, 11h of the glass ceramic wiring substrate 10 (the same applies for 10a and hereinafter) in the present mode of embodiment, but it preferably consists of a tabular alumina filler. The mean particle size of the tabular alumina filler is preferably 2 to 10 µm and more preferably 2 to 5 µm. Within such a range of particle sizes an improvement in the strength of the substrate can be achieved with little danger that the electrical properties of electronic components and the like will be impacted even if the wiring pitch of the wiring substrate is small.

From the viewpoint of further improving the strength of the glass ceramic multilayer wiring substrate 10, the mean thickness of the tabular alumina filler is preferably at most equal to 0.4 µm and more preferably 0.03 to 0.3 µm. By making the mean thickness of the tabular alumina filler small, the number of tabular alumina filler particles contained in the outside insulating layers 11a and 11c can be increased using the same filler content, and as a result cracks are less likely to propagate in the outside insulating layers 11a and 11c. Thus the strength of the glass ceramic multilayer wiring substrate 10 can be improved. On the other hand, if the mean thickness of the tabular alumina filler is thicker than a predetermined thickness there is an increased tendency for favorable orientation of the tabular alumina filler to be compromised, and there is a tendency for the crack suppression effect to deteriorate and for the strength improving effect to deteriorate.

From the viewpoint of further improving the strength of the glass ceramic multilayer wiring substrate 10, the mean aspect ratio of the tabular alumina filler is preferably at least equal to 25 and more, preferably 50 to 70. If the mean aspect ratio of the tabular alumina filler is too small there is a tendency for favorable orientation of the tabular alumina filler to deteriorate.

Figure 3:
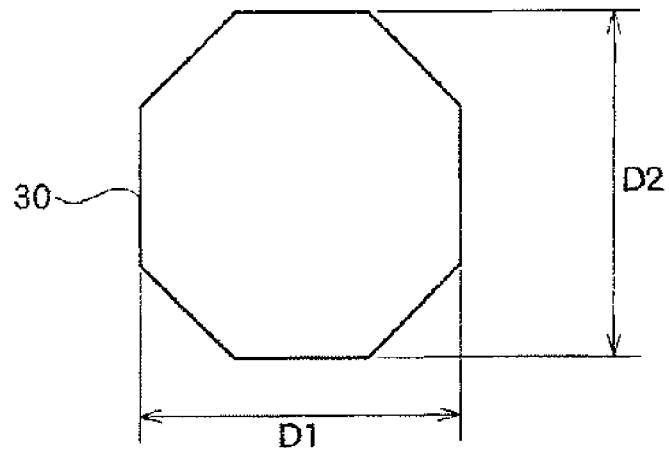
FIG. 3 is a top view illustrating an example of a filler contained in an outside insulating layer, illustrating the shape as viewed directly from above when the filler is allowed to stand on a flat plate which is horizontal to the filler plate surface.

FIG. 3 is a top view illustrating an example of a tabular alumina filler. FIG. 3 illustrates the plate surface shape when the external filler 30 is a tabular alumina filler. To elaborate, the plate surface of this tabular alumina filler has an octagonal shape. If the plate surface of the tabular alumina filler does not have a regular octagonal shape, as in FIG. 3, the particle size of the tabular alumina filler can be obtained as the mean value of the major diameter D1 and the minor diameter D2 of the plate surface. In other words, the particle size of the tabular alumina filler can be obtained as the mean value of the long side and the short side of the smallest rectangle inscribed in the tabular alumina filler. If the smallest quadrilateral inscribed in the tabular alumina filler is a square, the length of one side is the particle size.

The thickness of the tabular alumina filler is its maximum length in a direction perpendicular to the plate surface. The mean plate diameter and mean thickness are respectively the arithmetic mean values of measured values of the particle size and thickness of 500 tabular alumina filler particles sampled at random in an electron microscope image. The mean aspect ratio is computed by dividing mean particle size by mean thickness.

The tabular alumina filler contained in the outside insulating layers 11a, 11h in the present mode of embodiment is preferably one in which, as illustrated in FIG. 3, the planar shape as seen in a direction perpendicular to the plate surface is a shape having low anisotropy, such as a circle, an ellipse or a polygon approximating a circle or an ellipse. From the viewpoint of improving the strength of the glass ceramic multilayer wiring substrate 10, the planar shape of the tabular alumina filler is preferably a hexagon and more preferably a regular hexagon.

The outside insulating layers 11a and 11h may additionally contain ceramic fillers other than tabular alumina filler as the external filler 30. Examples that can be cited of ceramic fillers other than tabular alumina filler include spherical or irregularly shaped fillers formed from at least one material selected from a group comprising magnesium oxide, spinel, silica, mullite, forsterite, steatite, cordierite, strontium feldspar, quartz, zinc silicate, zirconia and titanium dioxide. From the viewpoint of reactive sintering behavior, a spherical or irregularly shaped alumina filler of the same material as the tabular alumina filler is preferable. A further increase in the strength of the glass ceramic multilayer wiring substrate 10 can be anticipated.

The internal filler will now be discussed. In the glass ceramic multilayer wiring substrate 10 of the present mode of embodiment, the internal filler contained in the glass ceramics constituting the inside insulating layers 11b to 11g is preferably an irregularly shaped or spherical ceramic filler. The mean particle size of the internal filler is preferably smaller than the mean particle size of the external filler, more specifically, preferably 0.5 to 10 µm and more preferably 1 to 5 µm.

If the mean particle size of the internal filler is too small, the sintering characteristics of the glass ceramic deteriorate and there is a tendency for problems relating to reliability, such as the generation of pores, to occur more readily. If the mean particle size is too large there is a danger that the electrical properties of electronic components and the like will be impacted if the wiring pitch of the wiring substrate is small.

Examples that can be cited of internal fillers that can be contained in the glass ceramics constituting the inside insulating layers 11b to 11g include spherical or irregularly shaped fillers formed from at least one material selected from a group comprising magnesium oxide, spinel, silica, mullite, forsterite, steatite, cordierite, strontium feldspar, quartz, zinc silicate, zirconia and titanium dioxide. From the viewpoint of reactive sintering behavior, a spherical or irregularly shaped alumina filler of the same material as the tabular alumina filler used as the external filler is preferably used as the internal filler.

Figure 4A:
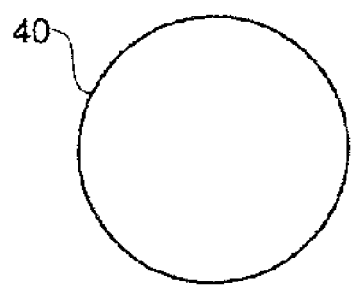
FIG. 4(A) and FIG. 4(B) are respectively top views illustrating examples of fillers contained in an inside insulating layer, illustrating the shape as viewed directly from above when the filler is allowed to stand on a flat plate which is horizontal to the filler plate surface.
Figure 4B:
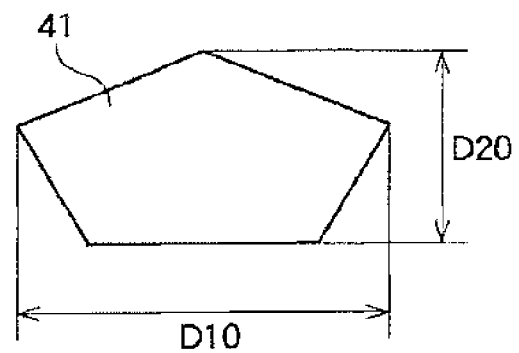

FIG. 4(A) and FIG. 4(B) are top views illustrating examples of spherical or irregularly shaped alumina fillers contained in the glass ceramic multilayer wiring substrate of the present mode of embodiment. FIG. 4(A) illustrates a spherical ceramic filler as one example of an internal filler 40. FIG. 4(B) illustrates the shape of an irregularly shaped ceramic filler as another example of an internal filler 41. The mean aspect ratio in this case is computed by dividing the maximum major diameter D10 by the width D20 orthogonal to the maximum major diameter of 500 ceramic filler particles which are randomly extracted in an electron microscope image and by getting the mean. Further, the particle size of an irregularly shaped ceramic filler can be obtained as the mean value ((D10+D20)/2) of the maximum major diameter D10 of the filler and the width D20 orthogonal to the maximum major diameter. The particle size of a spherical ceramic filler can be obtained by a usual method.

Various types of glass may be used as the glass which is the main component of the glass ceramics constituting the insulating layers 11a to 11h. Details are given hereinbelow. However, from the viewpoint of suppressing warping of the substrate and structural defects occurring in the interior of the substrate, it is desirable for the glass used in the outside insulating layers 11a, 11h and in the inside insulating layers 11b to 11g to have the same composition. If the compositions are different, depending on the construction the impact of differences in sintering behavior may be pronounced, and this is likely to result in warping and deformation.

The glass will now be discussed. Examples that can be cited of glass materials contained in the insulating layers 11a to 11h include glass powders comprising at least one of (1) amorphous glass-based materials, and (2) crystalline glass-based materials. (2) Crystalline glass-based materials are materials in which multiple microscopic crystals are caused to precipitate into the glass component during heating and sintering, and they are also known as glass ceramics.

From among (1) amorphous glass-based materials and (2) crystalline glass-based materials, the abovementioned glass is preferably formed using (2) crystalline glass-based materials. Examples of (2) crystalline glass-based materials that can be used include (i) glass containing $SiO_2$, $B_2O_3$, $Al_2O_3$ and alkaline earth metal oxides, and (ii) diopside crystal glass containing $SiO_2$, CaO, MgO, $Al_2O_3$ and CuO.

A preferred composition of the glass (i) in the present mode of embodiment will be described. The glass material preferably contains $SiO_2$, $B_2O_3$, $Al_2O_3$ and alkaline earth metal oxides. The $SiO_2$ content is preferably 46 to 60% by mass based on the total amount of glass, and more preferably 47 to 55% by mass. If the $SiO_2$ content in the glass (i) is too small, vitrification tends to be difficult. On the other hand, if the $SiO_2$ content in the glass (i) exceeds 60% by mass, the melting point increases and low-temperature sintering tends to be difficult to achieve.

The $B_2O_3$ content is preferably 0.5 to 5% by mass based on the total amount of glass, and more preferably 1 to 3% by mass. If the $B_2O_3$ content in the glass exceeds 5% by mass, moisture resistance tends to deteriorate. On the other hand, if the $B_2O_3$ content in the glass is less than 0.5% by mass, the vitrification temperature increases and the density tends to decrease.

The $Al_2O_3$ content is preferably 6 to 17.5% by mass based on the total amount of glass, and more preferably 7 to 16.5% by mass. If the $Al_2O_3$ content in the glass is too low, sufficiently high strength may be compromised. On the other hand, if the $Al_2O_3$ content in the glass is too large, vitrification tends to be difficult.

The alkaline earth metal oxide content is preferably 25 to 45% by mass based on the total amount of glass, and more preferably 30 to 40% by mass. Examples that can be cited of alkaline earth metal oxides include MgO, CaO, BaO and SrO. Only one of these alkaline earth metal oxides may be included, or two or more may be included. From among the alkaline earth metal oxides, it is preferable to include a combination of SrO and other alkaline earth metal oxides. By employing a combination of SrO and at least one selected from a group comprising CaO, MgO and BaO the viscosity of the molten glass is reduced allowing greater freedom in the sintering temperature. Thus the manufacture of the glass ceramic multilayer wiring substrates 10 and 10a can be made more straightforward.

The SrO content relative to the total amount of alkaline earth metal oxide is preferably at least equal to 60% by mass, and more preferably at least equal to 80% by mass. If the content is too small, the difference between thermal expansion coefficients of the glass and the tabular alumina filler increases, and the strength of the glass ceramic multilayer wiring substrate 10, 10a tends to deteriorate.

The total CaO, MgO and BaO content relative to the total amount of alkaline earth metal oxide is preferably at least equal to 1% by mass. The CaO and MgO contents relative to the total amount of alkaline earth metal oxide are each preferably at least equal to 0.2% by mass, and more preferably at least equal to 0.5% by mass. The CaO content relative to the total amount of alkaline earth metal oxide is preferably less than 10% by mass. The MgO content relative to the total amount of alkaline earth metal oxide is preferably equal to or less than 4% by mass. If the CaO and MgO contents are too large, the thermal expansion coefficient becomes too small, the strength of the glass ceramic multilayer wiring substrate 10, 10a tends to decrease and controlling the degree of crystallization of the glass tends to become more difficult. From the viewpoint of achieving simultaneously both ease of manufacture of the glass ceramic multilayer wiring substrate 10, 10a and strength of the glass ceramic wiring substrate, the total CaO and MgO content relative to the total amount of alkaline earth metal oxide is preferably less than 10% by mass. The CaO content relative to the total amount of alkaline earth metal oxide is preferably equal to or less than 5% by mass.

The BaO content relative to the total amount of alkaline earth metal oxide is preferably equal to or less than 5% by mass. If the content thereof is too large, the conductivity tends to increase.

A preferred composition of the glass in the crystal glass (ii) in the present mode of embodiment will now be described. In the crystal glass (ii), diopside crystal glass is caused to precipitate as the main crystal by sintering.

In diopside crystal glass, $SiO_2$ is a glass network former and is also a structural component of the diopside crystals. The $SiO_2$ content is preferably 40 to 65% by mass based on the total amount of diopside crystal glass, and more preferably 45 to 65% by mass. If the $SiO_2$ content is less than 40% by mass, vitrification tends to be difficult. On the other hand, if the $SiO_2$ content exceeds 65% by mass the density tends to decrease.

In diopside crystal glass, CaO is a structural component of the diopside crystals. The CaO content is preferably 20 to 35% by mass based on the total amount of diopside crystal glass, and more preferably 25 to 30% by mass. If the CaO content is too small, dielectric losses tend to increase. On the other hand, if the CaO content is too large, vitrification tends to be difficult.

In diopside crystal glass, MgO is a structural component of the diopside crystals. The MgO content is preferably 11 to 30% by mass based on the total amount of diopside crystal glass, and more preferably 12 to 25% by mass. If the MgO content is too small, crystals tend to precipitate less readily. On the other hand, if the MgO content is too large, vitrification tends to be difficult.

In diopside crystal glass, $Al_2O_3$ is a component used to regulate the crystallinity of the glass. The $Al_2O_3$ content is preferably 0.5 to 10% by mass based on the total amount of diopside crystal glass, and more preferably 1 to 5% by mass. If the $Al_2O_3$ content in the glass is too small, crystallinity becomes too strong, and glass formation tends to become more difficult. On the other hand, if the $Al_2O_3$ content exceeds 10% by mass, diopside crystals tend to precipitate less readily.

In diopside crystal glass, CuO is a component which donates electrons to Ag, suppressing diffusion thereof into the glass ceramic. The CuO content is preferably 0.01 to 1.0% by mass based on the total amount of the diopside crystal glass components. If the CuO content is too small, the effect discussed hereinabove tends not to be exhibited to a sufficient degree. On the other hand, if the CuO content is too large, dielectric losses tend to become too large.

In the diopside crystal glass components, SrO, ZnO and $TiO_2$ are components added in order to facilitate vitrification. The content of each component relative to the total amount of alkaline earth metal oxide is preferably 0 to 10% by mass, and more preferably 0 to 5% by mass. If there is too much of each individual component, crystallinity becomes weak, the amount of diopside that precipitates is reduced, and dielectric losses tend to increase.

Further, components other than the components mentioned above may also be included as diopside crystal glass components provided that characteristics such as dielectric losses are not compromised.

A non-shrink sintering method will now be discussed. Non-shrink sintering methods are used with the aim of improving the dimensional accuracy of the glass ceramic. In methods that are predominantly used, shrinkage in the x-y directions is suppressed by joining to both surfaces of an unsintered ceramic laminated body a soluble green sheet (shrinkage-suppressing green sheet) of a sintering-resistant material that does not sinter at the sintering temperature of the ceramic substrate material. Such a soluble green sheet of a sintering-resistant material acts as a constraining layer which suppresses shrinkage in the x-y directions during sintering and after sintering, thereby suppressing dimensional variations during shrinkage and achieving an improvement in dimensional accuracy.

Examples that can be cited of materials used as a shrinkage-suppressing green sheet, which acts as a constraining layer during sintering and after sintering (hereinafter referred to as 'shrinkage-suppressing material') include tridymite, cristobalite, quartz, fused quartz, alumina, mullite, zirconia, aluminum nitride, boron nitride, magnesium oxide, silicon carbide and calcium carbonate.

Preferred modes of embodiment of a glass ceramic multilayer wiring substrate of the present invention and a wiring substrate provided with the same have been described hereinabove, but the present invention is not restricted to the abovementioned modes of embodiment. There are no restrictions to the number of glass ceramic substrates provided in the wiring substrate or to the construction of the inner layer conductors, the surface conductors or the via conductors.

A method of manufacture will now be discussed. A preferred mode of embodiment of a method of manufacturing a glass ceramic multilayer wiring substrate of the present invention will now be described, taking the glass ceramic multilayer wiring substrate 10 as an example. FIG. 5A to FIG. 5D are process cross-sectional views used to explain the method of manufacturing the glass ceramic multilayer wiring substrate 10 illustrated in FIG. 1.

Figure 5A:
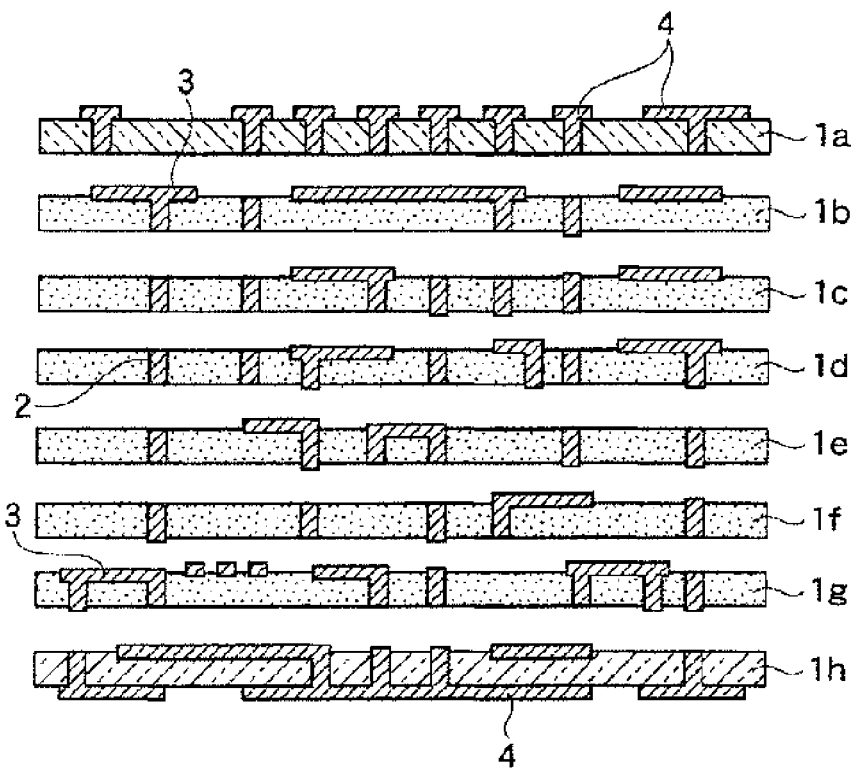
FIG. 5A is a process cross-sectional view illustrating schematically a method of manufacturing a glass ceramic multilayer wiring substrate according to a mode of embodiment of the present invention.

In the method of manufacturing a glass ceramic multilayer wiring substrate of the present mode of embodiment, first as illustrated in FIG. 5A green sheets 1a to 1h are prepared, on each of these one or more of a via conductor pattern 2, an inner layer conductor pattern 3 and a surface conductor pattern 4 being formed.

Outside insulating layer green sheets 1a, 1h contain glass and tabular alumina filler which is dispersed in the glass. The outside insulating layer green sheets 1a, 1h can be formed by the following procedure.

First, the tabular alumina filler 30 illustrated in FIG. 3, for example, is prepared. The tabular alumina filler 30 can be obtained, for example, by means of a manufacturing method having a reaction process in which an aluminate and an acidic aluminum salt are allowed to react in a hydrated state to yield a mixture containing alumina and/or hydrated alumina and a neutralized metal salt, and a sintering process in which said mixture is sintered at 1000 to 1600° C.

In the reaction process, first a sodium hydroxide solution is prepared by dissolving sodium hydroxide in water. A mixed solution in which metallic aluminum and disodium hydrogen phosphate are dissolved is prepared by mixing metallic aluminum and disodium hydrogen phosphate with the sodium hydroxide solution and agitating the mixture. An aqueous solution of aluminum sulfate is introduced into said mixed solution while agitating, until the pH reaches 6 to 8, yielding a cloudy gelatinous mixture (a mixture containing alumina and/or hydrated alumina and a neutralized metal salt). Said mixture is then dried, eliminating the water content.

In the sintering process, the dried mixture is sintered at 1000 to 1600° C. for 2 to 8 hours, yielding a sintered body. Water is added to the resulting sintered body, which is cleaned and filtered, and the resulting solid content is dried. A tabular alumina filler 30 having a predetermined size can be obtained by the process discussed hereinabove.

A slurry-like dielectric paste is prepared by mixing the tabular alumina filler 30 with, for example, glass powder and an organic vehicle containing, for example, a binder, a solvent, a plasticizer and a dispersing agent. Here, in order to achieve a favorable orientation of the tabular alumina filler, the tabular alumina filler must be adequately dispersed within the dielectric paste. It is thus preferable to perform mixing using a ball mill, and to perform mixing for a mixing time of at least 40 hours. Further, the tabular alumina filler 30 content in the dielectric paste is preferably 17.5 to 27.5% by volume. If the tabular alumina filler is not sufficiently dispersed, there is a tendency for the favorable orientation of the tabular alumina filler in the glass ceramic substrate to be compromised.

Examples that can be cited of binders include polyvinyl butyral resins and methacrylic acid resins. An example of a plasticizer that can be cited is dibutyl phthalate. Examples that can be cited of solvents include toluene and methyl ethyl ketone.

The prepared dielectric paste is, for example, formed into a film on a supporting body such as a polyethylene terephthalate (PET) sheet using a doctor blade method or the like. By this means it is possible to form the outside insulating layer green sheets 1a, 1h on the supporting body. By forming a film using a doctor blade method, the plate surface of the tabular alumina filler can be made to orientate such that it is substantially parallel to the main surface of the green sheet (the horizontal direction). By this means it is possible to form a glass ceramic substrate having sufficiently good strength.

The inside insulating layer green sheets 1b to 1g are next prepared. These green sheets contain glass and spherical or irregularly shaped ceramic filler (see FIG. 4(A), FIG. 4(B)) which is dispersed in the glass. The inside insulating layer green sheets 1b to 1h for the substrate can be formed by the following procedure.

First, the spherical or irregularly shaped ceramic filler is prepared. It is possible, for example, to use fillers formed from at least one material selected from a group comprising alumina, magnesium oxide, spinel, silica, mullite, forsterite, steatite, cordierite, strontium feldspar, quartz, zinc silicate, zirconia, and titanium dioxide. One or a plurality of fillers selected from these materials may be used. Further, in terms of the shape, those having an aspect ratio equal to or less than 2 are selected, but there is no particular restriction to the method of manufacturing the filler.

In the same way as with the tabular alumina filler, these are made into a dielectric paste, using, for example, polyvinyl butyral resin, methacrylic acid resin or the like as a binder, dibutyl phthalate or the like as a plasticizer, and toluene, methyl ethyl ketone or the like as a solvent, and a green sheet is prepared by forming this into a film on a supporting body such as a polyethylene terephthalate (PET) sheet using a doctor blade method or the like.

The content of the filler 40 or 41 in the inorganic filler comprising the glass combined with the ceramic filler, in the dielectric paste, is preferably adjusted to be 25.0 to 35.0% by volume.

Further, in regard also to the shrinkage-suppressing green sheets 5 illustrated in FIG. 5B, after having selected a material that will remain unsintered under the sintering conditions of the glass ceramic, such as tridymite, cristobalite, quartz, fused quartz, alumina, mullite, zirconia, aluminum nitride, boron nitride, magnesium oxide, silicon carbide or calcium carbonate, a shrinkage-suppressing material paste is made in the same way as discussed hereinabove. After that, the green sheet 5 is prepared by forming this into a film on a supporting body such as a polyethylene terephthalate (PET) sheet using a doctor blade method or the like.

Conductor patterns (for example, wiring patterns, external connection pad or upper-lower layer connecting via patterns) are next formed on the substrate green sheets 1a to 1h. More specifically, through-holes (via holes) are formed in predetermined positions on the substrate green sheets 1a to 1h, and a via conductor pattern 2 for connecting wiring on upper and lower layers is formed by filling these with a conductor paste. Further, a conductor paste is printed in a predetermined pattern onto the surface of the substrate green sheets 1b to 1g which will become inner layers, to form inner layer conductor patterns 3. Moreover, surface conductor patterns 4 are formed on the outside insulating layer green sheets 1a and 1h, which will be disposed on the outermost sides. It should be noted that electronic elements (inductors, capacitors and the like) may be formed as required on the substrate green sheets 1a to 1h.

The electrically conductive paste used to form the conductor patterns can, for example, be prepared by kneading an electrically conductive material comprising various electrically conductive metals or alloys such as Ag, Ag—Pd alloys, Cu and Ni, with an organic vehicle. The organic vehicle used in the electrically conductive paste contains a binder and a solvent as its main components. There is no particular restriction to the compounding ratio of the binder, the solvent and the electrically conductive material, but, for example, 1 to 15% by mass of binder and 10 to 50% by mass of solvent, relative to the electrically conductive material, may be compounded. Additives selected from various dispersing agents, plasticizers and the like may be added to the electrically conductive paste as required.

Figure 5B:
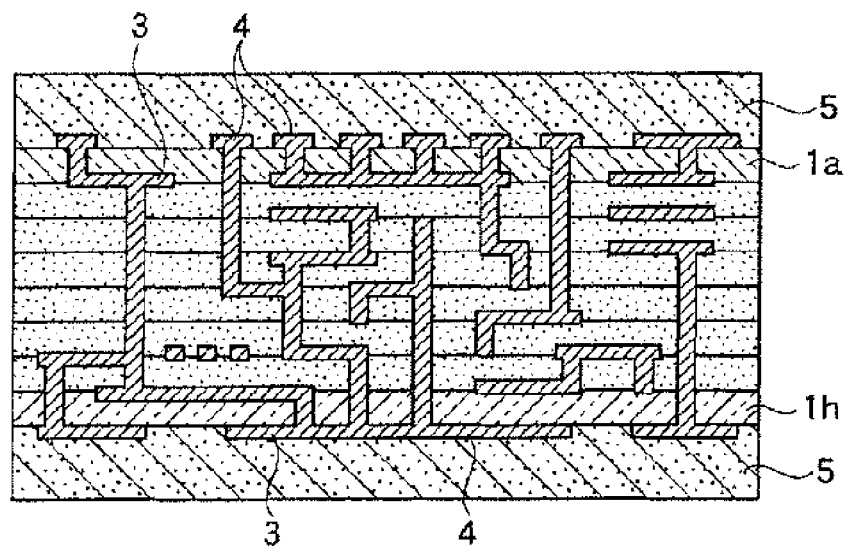
FIG. 5B is a process cross-sectional view illustrating the process following FIG. 5A.

Next, as illustrated in FIG. 5B, the green sheets 1a to 1h are laminated in this order, yielding a laminated body. A pair of shrinkage-suppressing green sheets 5 constituting constraining layers is disposed in such a way as to sandwich the laminated body in the direction of lamination. By sandwiching the laminated body comprising the green sheets 1a to 1h, which will become the wiring substrate 10 or 10a, between the shrinkage-suppressing green sheets 5, it is possible to suppress shrinkage of the laminated body in the in-plane direction (a direction perpendicular to the direction of lamination) during sintering, discussed hereinafter.

Further, by suppressing shrinkage of the laminated body in the in-plane direction in this way, it is possible to reduce warping of the substrate and variations in the dimensions in the in-plane direction generated by variations in the degree of shrinkage.

Figure 5C:
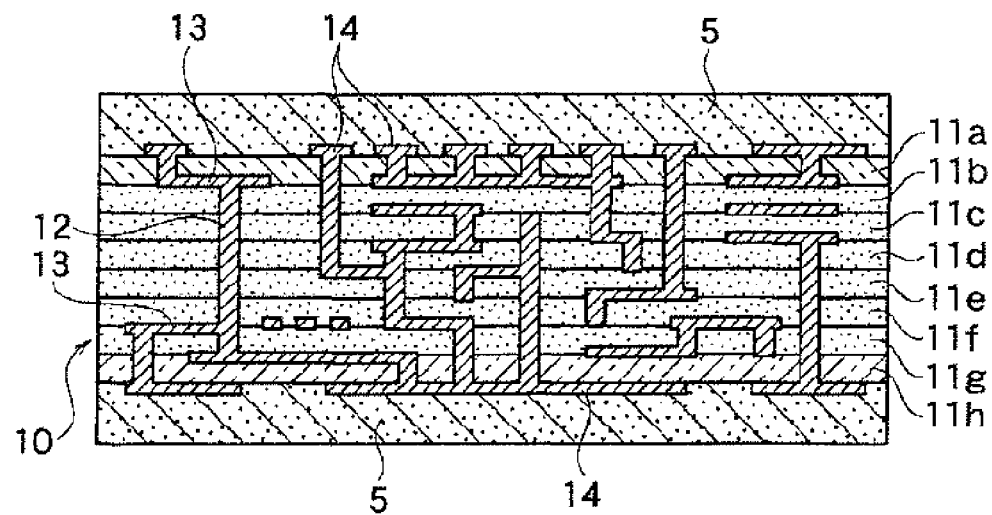
FIG. 5C is a process cross-sectional view illustrating the process following FIG. 5B.

Next, the laminated body on both sides of which the shrinkage-suppressing green sheets 5 have been disposed (a temporary stack) is pressed. By performing sintering after pressing, the green sheets 1a to 1h become insulating layers 11a to 11h consisting of glass ceramic, and the via conductor patterns 2 within the via holes become via conductors 12, as illustrated in FIG. 5C. Further, the inner layer conductor patterns 3 become internal conductor layers 13 and the surface conductor patterns 4 become surface conductor layers 14.

Figure 5D:
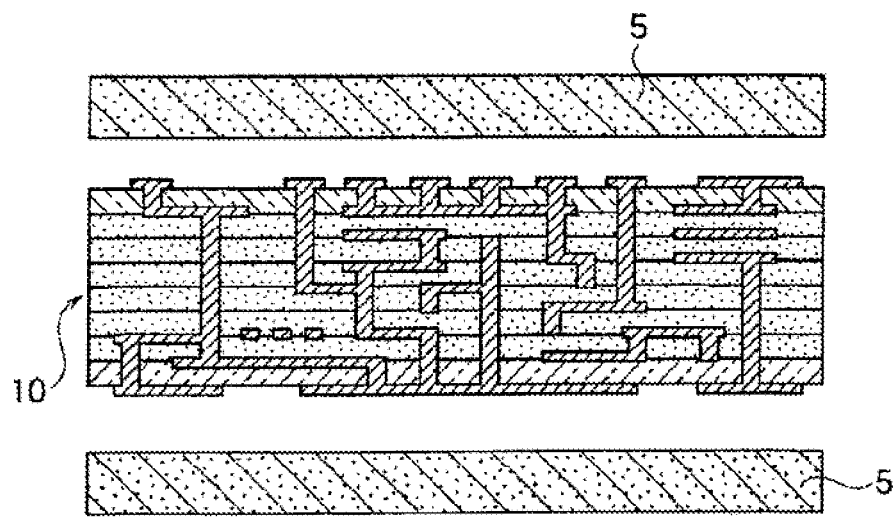
FIG. 5D is a process cross-sectional view illustrating the process following FIG. 5C.

Next, as illustrated in FIG. 5D, the shrinkage-suppressing green sheets 5 are peeled from the glass ceramic multilayer wiring substrate 10. By means of the processes described hereinabove, a glass ceramic multilayer wiring substrate 10 having insulating layers comprising glass ceramic can be obtained.

Figure 6:
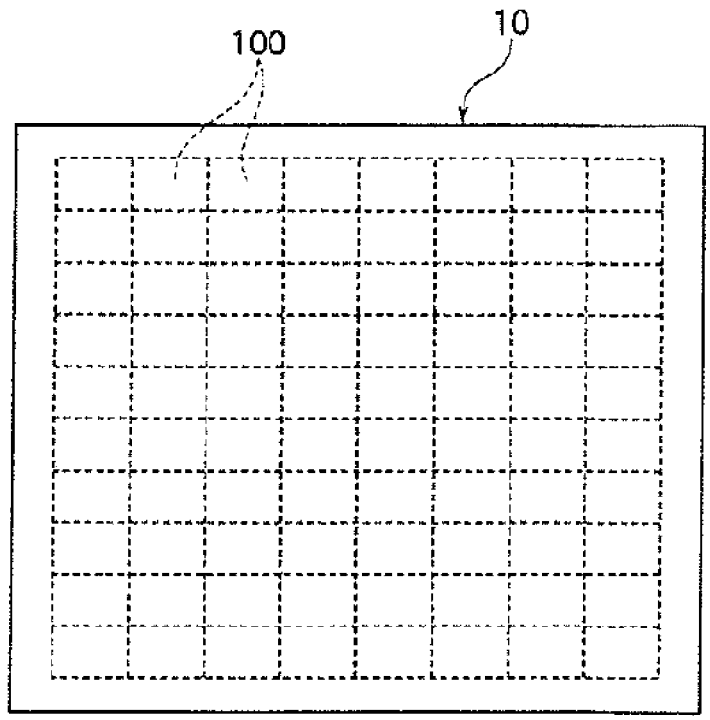
FIG. 6 is a plan view of a glass ceramic multilayer wiring substrate according to a mode of embodiment of the present invention, illustrating schematically a mode in which basic structures constituting a circuit are disposed with a desired pitch.

It should be noted that in general such a glass ceramic multilayer wiring substrate 10 has an aggregate structure in which, as illustrated in FIG. 6, basic structures 100 constituting circuits are arranged with a desired pitch.

Next, metal may be applied to the surface conductor pattern as required by plating. At this time, a metal such as nickel or palladium may be applied as a base for the metal plating.

A method of manufacturing the glass ceramic multilayer wiring substrate 10 illustrated in FIG. 1 has been described hereinabove, but the method of manufacturing the glass ceramic multilayer wiring substrate of the present invention is not restricted to the method discussed hereinabove.

With the mode of embodiment of the present invention, by making the thermal expansion coefficient of the outside insulating layers 11a, 11h smaller than the thermal expansion coefficient of the inside insulating layers 11b to 11g, a multilayer wiring substrate having high strength can be achieved. It is thought that the reason for this is that by making the thermal expansion coefficient of the outside insulating layers 11a, 11h smaller than that of the inside insulating layers 11b to 11g, a compressive stress acts on the surface in the cooling process during substrate sintering, resulting in an effect whereby the strength is increased.

It is further thought that by making a first aspect ratio representing the oblateness and sphericity of the external filler 30 contained in the outside insulating layers 11a, 11h larger than a second aspect ratio representing the oblateness and sphericity of the internal filler 40, 41 contained in the inside insulating layers 11b to 11g, this also results in an effect whereby the strength is increased. The outside insulating layers 11a, 11h are the portions most susceptible to external stress, and by increasing the first aspect ratio of the outer layer filler 30 contained in these portions, the degree of oblateness of the filler increases, and cracks originating in the outside insulating layers 11a, 11h are less likely to occur. The inventors assume that as a result, even if the substrate 10, 10a is thin, the propagation of cracks to the interior of the substrate is effectively suppressed, and that at the same time this is a factor contributing to an improvement in strength.

Further, in the present mode of embodiment, by employing as the internal filler 40, 41 one that has a small aspect ratio, the flatness of the outer surface on which the surface conductor layer 14 is formed can be improved even in the case of a multilayer wiring substrate 10, 10a having via conductors 12.

It should be noted that if a filler having a high aspect ratio is used in the glass ceramic forming the inside insulating layers 11b to 11g, the filler becomes oriented in a direction parallel to the sheet surface during manufacture of the green sheet, as a result of which the shrinkage in the sheet lamination direction (a direction perpendicular to the sheet surface) during sintering increases, thereby increasing the difference in shrinkage compared with that of the electrically conductive metal powder used in the wiring. In particular, with substrates 10, 10a with embedded via electrodes 12, the impact of this is that undulations on the substrate surface tend to become larger, and thus by using for the ceramic filler used as the internal filler 40, 41 an irregularly shaped filler or a spherical filler having a low aspect ratio an outer surface having excellent flatness can be achieved. By ensuring the flatness of the outer surface of the substrate it becomes straightforward to adjust a position relative to the substrate in order to mount ICs and the like.

It should be noted that in the present mode of embodiment the thermal expansion coefficient of the outside insulating layers 11a, 11h is made smaller than the thermal expansion coefficient of the inside insulating layers 11b to 11g, but there is no particular restriction to the means for achieving this, and the following means are, for example, conceivable.

As first means, the amount of added external filler contained in the outside insulating layers 11a, 11h should be varied relative to the amount of added internal filler contained in the inside insulating layers 11b to 11g, without changing the type of glass contained in each insulating layer 11a to 11h. More specifically, the external filler included in the outside insulating layers 11a, 11h should be a tabular alumina filler, the internal filler included in the inside insulating layers 11b to 11g should be an irregularly shaped alumina filler, and the proportion of external filler that is added should be less than the proportion of internal filler that is added. However, this applies if the linear expansion coefficient of the glass is smaller than that of alumina, and if conversely the linear expansion coefficient of the glass is larger than that of alumina, the same effect can be achieved by making the proportion of external filler that is added more than the proportion of internal filler that is added.

As second means, the contained proportion of an oxide having a large impact on the thermal expansion coefficient may be adjusted without varying the relationship between the basic compositions of the glass constituting the outside insulating layers 11a, 11h and the glass constituting the inside insulating layers 11b to 11g. It may, for example, be adjusted by varying the content of the SrO or the content of the CaO and MgO contained in the glass, between the outside insulating layers 11a, 11h and the inside insulating layers 11b to 11g.

As third means, the material of the external filler contained in the outside insulating layers 11a, 11h should be varied relative to the material of the internal filler contained in the inside insulating layers 11b to 11g, without changing the type of glass contained in the insulating layers 11a to 11h. More specifically, it is also possible to obtain a similar effect by arranging that the linear expansion coefficient of the outside insulating layers 11a, 11h is made smaller than that of the inside insulating layers 11b to 11g, e.g., by arranging that the external filler included in the outside insulating layers 11a, 11h is a tabular alumina filler, and the internal filler included in the inside insulating layers 11b to 11g is mullite having a linear expansion coefficient that is larger than that of alumina.

The relationship between the thermal expansion coefficient $\alpha o$ of the outside insulating layers 11a, 11h and the thermal expansion coefficient $\alpha i$ of the inside insulating layers 11b to 11g is preferably such that $\alpha i - \alpha o$ is 0.1 to 1.0 ppm/° C. If this difference is too small, the operational advantages of the present mode of embodiment are reduced, and if the difference is too large, cracks are likely to occur in the vicinity of the interface between the outside insulating layers and the inside insulating layers, causing problems in terms of reliability.

Further, in the present mode of embodiment, a first aspect ratio A1 representing the oblateness/sphericity of the external filler contained in the outside insulating layers 11a, 11h is larger than a second aspect ratio A2 representing the oblateness/sphericity of the internal filler contained in the inside insulating layers 11b to 11g, and preferably (A1-A2) is 20 to 70. If this difference is too small, the operational advantages of the present mode of embodiment are reduced, and if the difference is too large, the difference between the sintering behaviors of the outside insulating layers and the inside insulating layers during sintering becomes larger, and there is a tendency for deformation of the glass ceramic multilayer wiring substrate to occur more readily.

More preferably, in the present mode of embodiment the second aspect ratio A2 is at most equal to 2. Further, preferably the first aspect ratio A1 is at least equal to 25. To elaborate, by increasing the first aspect ratio of the outer layer filler, the degree of oblateness of the filler increases, and cracks originating in the outside insulating layers are less likely to occur. The inventors assume that as a result, even if the substrate is thin, the propagation of cracks to the interior of the substrate is effectively suppressed, and that at the same time this is a factor contributing to an improvement in strength.

In the present mode of embodiment, the proportion of the total thickness (Ta+Th) of the outside insulating layers 11a, 11h illustrated in FIG. 1 is 5 to 20% of the total thickness (To) of the multilayer wiring substrate. If the proportion of the total thickness (Ta+Th) of the outside insulating layers 11a, 11h containing filler having a relatively large aspect ratio is too small compared with the total thickness of the substrate (To), the effect of improving the strength of the substrate tends to decrease, and if it is too large, the flatness of the outer surface tends to deteriorate.

It should be noted that there is no particular restriction to the thicknesses Ta, Th of each outside insulating layer 11a, 11h, but they are, for example, 20 to 100 μm. Further, the thicknesses of each inside insulating layer 11b to 11g may be the same as or different from the thicknesses Ta, Th of the outside insulating layers 11a, 11h.

Figure 7:
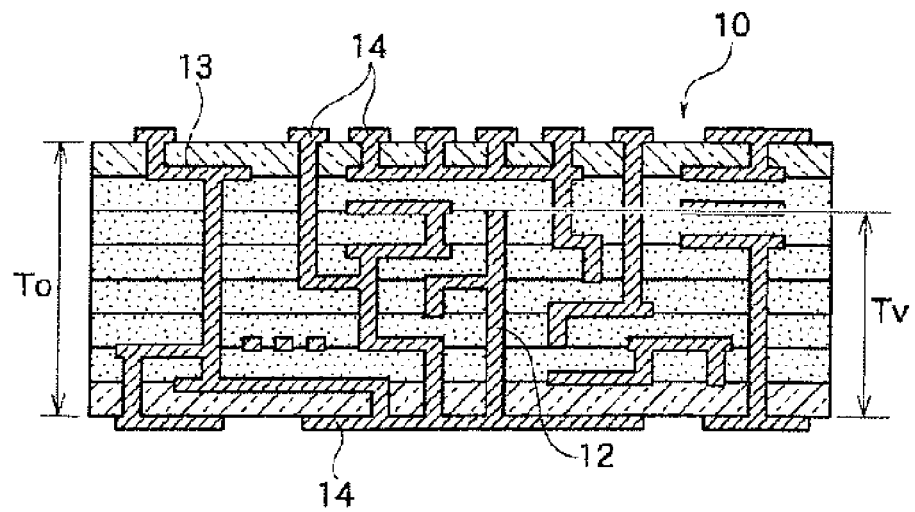
FIG. 7 is a cross-sectional view used to explain the via conductor ratio of a glass ceramic multilayer wiring substrate, illustrating a cross section in the vicinity of the center of a basic structure constituting a circuit disposed with a desired pitch within the substrate.

In the present mode of embodiment, in particular if, as illustrated in FIG. 7, a via conductor ratio, defined as a value obtained by dividing the length Lv of the longest via conductor in the direction of thickness in the multilayer wiring substrate 10 by the total thickness To of the multilayer wiring substrate 10, is equal to or greater than 0.4 (40%), the effect is particularly large. With multilayer wiring substrates in which the via conductor ratio is equal to or greater than 0.4, it is difficult with the prior art to achieve simultaneously both an improvement in the strength of the substrate and an improvement in the flatness of the outer surface. Because the present mode of embodiment has the configuration discussed hereinabove it is possible to achieve both of these simultaneously.

Further, in the present mode of embodiment, the mean particle size Do of the external filler is larger than the mean particle size Di of the internal filler. If the mean particle size Di of the internal filler is too large there is a danger that the via conductors or the internal conductor layers will be adversely affected. By making the mean particle size Do of the external filler larger than the mean particle size Di of the internal filler, the effects of improving the strength of the substrate and of improving the degree of flatness of the outer surface of the substrate are increased. Preferably Do minus Di is 2.0 to 7.0 μm. Within such a range, the operational advantages of the present mode of embodiment are increased.

It should be noted that the present invention is not limited to the mode of embodiment discussed hereinabove, and various modifications can be made within the scope the present invention.

For example, in the mode of embodiment discussed hereinabove a non-shrink sintering technique was used, and thus the shrinkage-suppressing green sheets 5 illustrated in FIG. 5B to FIG. 5D were used, but shrinkage-suppressing green sheets 5 need not necessarily be used in the present invention. Warping can be sufficiently suppressed by forming the outside insulating layers 11a, 11h using a glass ceramic composition containing a tabular alumina filler. It is thought that this is attributable to the fact that glass ceramic compositions containing a tabular alumina filler have a high resilience. However, from the viewpoint of achieving substrate warping suppression and surface flatness simultaneously, non-shrink sintering techniques may in addition be used.

Further, in the mode of embodiment discussed hereinabove, a small amount of an irregularly shaped or spherical filler having a low aspect ratio may be added to the outside insulating layers 11a, 11h in addition to the tabular filler having a large aspect ratio. For example, if the total proportion by volume of filler added to the outside insulating layers 11a, 11h is 100% by volume, then a small amount of an irregularly shaped or spherical filler having a low aspect ratio may be added in a proportion equal to or less than 2.0% thereof. Further, similarly, in relation to the inside insulating layers 11b to 11g, not only can an irregularly shaped or spherical filler having a low aspect ratio be used, but if, for example, the total proportion by volume of filler added to the inside insulating layers 11b to 11g is 100% by volume, then a small amount of a tabular filler having a large aspect ratio may be added in a proportion equal to or less than 50.0% thereof.

The present invention will now be described based on more detailed embodiments, but the present invention is not restricted to these embodiments.

A first embodiment (Embodiment 1) relates to fabrication of a glass ceramic multilayer wiring substrate. Glass powder (glass having $SiO_2$, $B_2O_3$, $Al_2O_3$ and SrO as the main components), tabular alumina filler (external filler) and irregularly shaped alumina filler (internal filler) were prepared. The tabular alumina filler A and the irregularly shaped alumina filler A in Table 1 were used as the tabular alumina filler and the irregularly shaped alumina filler.

TABLE 1

| Filler type | Mean particle size | Aspect ratio |
|---|---|---|
| Irregularly shaped alumina filler A | 1.5 | 1.2 |
| Irregularly shaped alumina filler B | 1.2 | 1.1 |
| Irregularly shaped mullite filler A | 1.6 | 1.2 |
| Tabular alumina filler A | 5.0 | 50.0 |
| Tabular alumina filler B | 5.0 | 70.0 |
| Tabular alumina filler C | 5.0 | 25.0 |
| Fused $SiO_2$ | 1.0 | 1.0 |

It should be noted that the mean particle size and the aspect ratio in the abovementioned Table 1 are defined as follows. The mean particle size is defined as follows: In the case of irregularly shaped alumina filler, the mean particle size was taken to be the mean particle diameter of the cumulative 50% particle diameter which is a volume mean diameter, obtained using a laser diffraction particle size distribution measuring device. Further, in the case of tabular alumina filler, the mean particle size was taken to be the mean value of the major diameter D1 and the minor diameter D2 of the plate surface for 500 tabular alumina filler particles.

With regard to the aspect ratio, in the case of irregularly shaped alumina filler it was taken to be a value computed from the mean of the maximum major diameter D10 devided by the width D20 orthogonal to the maximum major diameter for 500 ceramic filler particles sampled at random in an electron microscope image. In the case of tabular alumina filler, the filler thickness was taken to be the maximum length in a direction perpendicular to the plate surface, and after obtaining the arithmetic mean of the measured values of the particle size and the thickness of 500 tabular alumina filler particles selected at random in an electron microscope image, the mean aspect ratio was computed by dividing the mean particle size by the mean thickness.

Next, an organic vehicle was prepared by mixing 19.4 g of an acrylic-based resin, 59.1 g of toluene, 3 g of ethanol and 6.5 g of a plasticizer (butylphthalyl butylglycolate). Then, organic vehicles prepared respectively with glass powder, tabular alumina filler or irregularly shaped alumina filler were formulated and were mixed for 60 hours using a ball mill to prepare coatings for forming substrate green sheets 2a to 2c. The content of tabular alumina filler in the glass ceramic and the content of irregularly shaped alumina filler in the glass ceramic were respectively the contents shown in Table 2.

The prepared substrate green sheet coatings were formed into films on a polyethylene terephthalate film using a doctor blade, and a plurality of outside insulating layer green sheets containing tabular alumina and inside insulating layer green sheets containing irregularly shaped alumina were formed.

Similarly, shrinkage-suppressing green sheets comprising alumina were prepared in the same way as described hereinabove, except that irregularly shaped alumina filler alone was used instead of glass powder and tabular or irregularly shaped alumina filler.

Insulating layer green sheets were then cut to a size of 4×4 inches, after which via holes having a diameter of 100 μm were formed by punching. Via conductor patterns in which the green sheets in which via holes had been formed were filled with electrically conductive paste using a screen printing method were formed, and internal conductor patterns and surface conductor patterns were also formed. At this time, the surface conductor patterns were formed by screen-printing an outer surface electrode material onto the outside insulating layer green sheets containing tabular alumina.

Next, as illustrated in FIG. 5B, the insulating layer green sheets were laminated in a suitable order, yielding a laminated body. Further, a pair of shrinkage-suppressing green sheets 5 constituting constraining layers was disposed in such a way as to sandwich the laminated body in the direction of lamination. In this way, a plurality of green sheets on which the via conductor patterns, the internal conductor patterns and the surface conductor patterns had been formed were laminated, after which they were thermocompression bonded, thereby manufacturing a laminated body having an integrated glass ceramic multilayer wiring structure. At this time, pressing was performed with a pressure of 50 MPa.

At this time, the thickness after sintering of the outside insulating layers comprising glass ceramic containing tabular alumina, and the thickness after sintering of the glass ceramic layers containing irregularly shaped alumina were respectively arranged so as to be the thicknesses indicated in Table 2. Further, the actual via conductor ratios in the substrate structure, defined as illustrated in FIG. 7 discussed hereinabove, are as indicated in Table 2.

Further, the temperature of the laminated body was raised to 400° C. at a rate of 1.5° C./min, and from 400° C. to 900° C. at a rate of 10° C./min, it was sintered by being maintained for 25 minutes at 900° C., after which the constraining layers were removed to yield a glass ceramic multilayer wiring substrate for evaluation. A glass ceramic multilayer wiring substrate for configuration of a desired circuit was manufactured through the processes described hereinabove.

A second embodiment (Embodiment 2) relates to fabrication of a glass ceramic multilayer wiring substrate. As indicated in Table 2, a glass ceramic multilayer wiring substrate was fabricated using the same method as in embodiment 1, except that the tabular alumina filler C and irregularly shaped alumina filler A in Table 1 were used as the external filler and the internal filler.

A third embodiment (Embodiment 3) relates to fabrication of a glass ceramic multilayer wiring substrate. As indicated in Table 2, a glass ceramic multilayer wiring substrate was fabricated using the same method as in embodiment 1, except that the via conductor ratio was changed.

A fourth embodiment (Embodiment 4) relates to fabrication of a glass ceramic multilayer wiring substrate. As indicated in Table 2, a glass ceramic multilayer wiring substrate was fabricated using the same method as in embodiment 1, except that the tabular alumina filler A and the irregularly shaped mullite filler A in Table 1 were used as the external filler and the internal filler, and the linear expansion coefficients of the ceramic layers were changed by adjusting the respective amounts of filler.

A fifth embodiment (Embodiment 5) relates to fabrication of a glass ceramic multilayer wiring substrate. As indicated in Table 2, a glass ceramic multilayer wiring substrate was fabricated using the same method as in embodiment 1, except that the irregularly shaped alumina filler A in Table 1 was used as the internal filler, and the tabular alumina filler A to which a predetermined amount of a fused silica ($SiO_2$) filler (spherical, having an aspect ratio of 1; mean particle size of 1 μm) had been added was used as the external filler, and the via conductor ratio was changed.

Comparative examples 1, 2, 3 relate to the fabrication of a glass ceramic multilayer wiring substrate. As indicated in Table 2, glass ceramic wiring substrates were fabricated using the same method as in embodiment 1, except that the tabular alumina filler A in Table 1 was used as both the external filler and the internal filler, the amount of filler was unified to 23% by volume in each case, and the via conductor ratio was varied.

Comparative example 4 relates to the fabrication of a glass ceramic multilayer wiring substrate. As indicated in Table 2, a glass ceramic wiring substrate was fabricated using the same method as in embodiment 1, except that the irregularly shaped alumina filler A in Table 1 was used as both the external filler and the internal filler, and the amount of filler was unified to 30% by volume in each case.

Comparative example 5 relates to the fabrication of a glass ceramic multilayer wiring substrate. As indicated in Table 2, a glass ceramic wiring substrate was fabricated using the same method as in embodiment 1, except for the amounts of filler that were added. To elaborate, a glass ceramic wiring substrate was fabricated, with the linear expansion coefficient of the outside insulating layers arranged so as to be larger than that of the inside insulating layers, the reverse of the case in embodiment 1, by arranging that the amount of the irregularly shaped alumina filler A added as the internal filler was 10% by volume and the amount of the tabular alumina filler A added as the external filler was 28% by volume.

Comparative example 6 relates to the fabrication of a glass ceramic multilayer wiring substrate. As indicated in Table 2, a glass ceramic wiring substrate was fabricated using the same method as in embodiment 4, except for the amounts of filler that were added. To elaborate, a glass ceramic wiring substrate was fabricated, with the linear expansion coefficient of the outside insulating layers arranged so as to be larger than that of the inside insulating layers, the reverse of the case in embodiment 4, by arranging that the amount of the irregularly shaped mullite filler A added as the internal filler was 30% by volume and the amount of the tabular alumina filler A added as the external filler was 28% by volume.

Comparative example 7 relates to the fabrication of a glass ceramic multilayer wiring substrate. As indicated in Table 2, a glass ceramic wiring substrate was fabricated using the same method as in embodiment 1, except that the tabular alumina filler A in Table 1 was used as the internal filler, and the irregularly shaped alumina filler A was used as the external filler, the amounts thereof being adjusted to predetermined filler amounts, and the relationship between the aspect ratios was arranged so as to be the reverse of that in embodiment 1.

Comparative example 8 relates to the fabrication of a glass ceramic multilayer wiring substrate. As indicated in Table 2, a glass ceramic wiring substrate was fabricated using the same method as in comparative example 7, except that the added amount of the internal filler was changed, and the relationship between the linear expansion coefficients was arranged so as to be the reverse of that in comparative example 7.

TABLE 2

| | Substrate structure | | | | | | | | | | |
|---|---|---|---|---|---|---|---|---|---|---|---|
| | | Inside insulating layer | | | | Outside insulating layer | | | | | |
| | Substrate thickness (mm) | Inner layer thickness (mm) | Internal filler | Filler amount (vol. %) | Linear expansion coefficient α of glass ceramic layer (ppm/° C.) | Outside layer thickness (mm) (Total top and bottom) | External filler | Filler amount (volume %) | Linear expansion coefficient α of glass ceramic layer (ppm/° C.) | Via conductor ratio (%) | Degree of flatness (μm) | Substrate strength (N) |
|---|---|---|---|---|---|---|---|---|---|---|---|---|
| Embodiment 1 | 0.4 | 0.32 | Irregularly shaped alumina A | 30 | 6.4 | 0.06 | Tabular alumina A | 23 | 6.2 | 80 | 8.1 | 15.6 |
| Embodiment 2 | 0.4 | 0.32 | Irregularly shaped alumina A | 30 | 6.4 | 0.06 | Tabular alumina C | 23 | 6.3 | 80 | 7.1 | 15.2 |
| Embodiment 3 | 0.4 | 0.32 | Irregularly shaped alumina A | 30 | 6.4 | 0.06 | Tabular alumina A | 23 | 6.2 | 100 | 10.2 | 15.1 |
| Embodiment 4 | 0.4 | 0.32 | Irregularly shaped alumina A | 20 | 6.2 | 0.06 | Tabular alumina A | 20 | 6.1 | 80 | 9.5 | 15.0 |
| Embodiment 5 | 0.4 | 0.32 | Irregularly shaped alumina A | 30 | 6.4 | 0.06 | Tabular alumina A Fused SiO2 | 23 2 | 6.1 | 100 | 10.5 | 15.5 |
| Comparative example 1 | 0.4 | 0.32 | Tabular alumina A | 23 | 6.3 | 0.06 | Tabular alumina A | 23 | 6.2 | 30 | 11.1 | 15.5 |
| Comparative example 2 | 0.4 | 0.32 | Tabular alumina A | 23 | 6.3 | 0.06 | Tabular alumina A | 23 | 6.2 | 80 | 22.5 | 15.5 |
| Comparative example 3 | 0.4 | 0.32 | Tabular alumina A | 23 | 6.3 | 0.06 | Tabular alumina A | 23 | 6.2 | 100 | 23.8 | 15.3 |
| Comparative example 4 | 0.4 | 0.32 | Irregularly shaped alumina A | 30 | 6.4 | 0.06 | Irregularly shaped alumina A | 30 | 6.4 | 80 | 8.0 | 13.2 |
| Comparative example 5 | 0.4 | 0.32 | Irregularly shaped alumina A | 10 | 6.1 | 0.06 | Tabular alumina A | 28 | 6.6 | 80 | 9.4 | 12.4 |
| Comparative example 6 | 0.4 | 0.32 | Irregularly shaped mullite A | 30 | 5.8 | 0.06 | Tabular alumina A | 28 | 6.6 | 80 | 8.0 | 12.2 |
| Comparative example 7 | 0.4 | 0.32 | Tabular alumina A | 28 | 6.6 | 0.06 | Irregularly shaped alumina A | 30 | 6.4 | 80 | 26.5 | 14.7 |
| Comparative example 8 | 0.4 | 0.32 | Tabular alumina A | 23 | 6.2 | 0.06 | Irregularly shaped alumina A | 30 | 6.4 | 80 | 21.6 | 11.5 |

As indicated in Table 2, the via conductor ratio, the degree of flatness of the outer surface of the substrate sample, and the substrate strength were obtained using the following methods, for sample substrates according to each embodiment and each comparative example.

As discussed hereinabove in the description of FIG. 7, the via conductor ratio (%) is defined as a value (represented as %) obtained by dividing the length Lv of the longest via conductor in the direction of thickness in the multilayer wiring substrate 10 by the total thickness To of the multilayer wiring substrate 10.

Further, the degree of flatness is defined by the following formula (1), and in Table 2 is obtained as the mean value of 30 samples.

$$[(\text{Thickness at thickest location in substrate}) - (\text{Thickness at thinnest location in substrate})]/2 \qquad (1)$$

Further, the substrate strength is a value obtained by evaluating the strength of a substrate sample cut into strips of length 30 mm and width 5.5 m, using a three-point bending test conforming to JIS C2141. The values in Table 2 were obtained as the mean value of 30 samples.

As can be seen from Table 2, it was confirmed that with a glass ceramic multilayer wiring substrate using entirely tabular alumina filler, the degree of flatness of the surface deteriorates as the via ratio increases, as illustrated by the comparative examples 1 to 3. Further, in the case of the comparative example 4 which uses only irregularly shaped alumina filler, the flatness is satisfactory but a high substrate strength could not be obtained. Further, in the comparative examples 5, 6, 8 in which the linear expansion coefficient of the glass ceramic constituting the outside insulating layers is larger than that of the inside insulating layers, a high strength could not be obtained. Further, in comparative examples 7 and 8 in which the relationship between the aspect ratios of the external filler and the internal filler is the reverse of that in the embodiments flatness is poor and a high substrate strength could not be obtained. In contrast to the comparative examples, it was possible to confirm that in the embodiments the flatness and substrate strength are good even if the via conductor ratio is high.

Embodiment 10

As indicated in Table 3, a glass ceramic wiring substrate was fabricated using the same method as in embodiment 1, except that the irregularly shaped alumina filler B in Table 1 was used as the internal filler, and the tabular alumina filler B was used as the external filler, the linear expansion coefficients were made to have a predetermined relationship by adjusting the amounts of each filler added, and the total thickness of the inside insulating layers and the outside insulating layers was changed.

Comparative example 10 relates to the fabrication of a glass ceramic multilayer wiring substrate. As indicated in Table 3, a glass ceramic wiring substrate was fabricated using the same method as in embodiment 10, except that the irregularly shaped alumina filler B in Table 1 was used as both the external filler and the internal filler, and the amount of filler was unified to 33% by volume in each case.

Comparative example 11 relates to the fabrication of a glass ceramic multilayer wiring substrate. As indicated in Table 3, a glass ceramic wiring substrate was fabricated using the same method as in embodiment 10, except that the tabular alumina filler B in Table 1 was used as both the external filler and the internal filler, and the amounts of filler were 22% by volume and 25% by volume respectively.

TABLE 3

| | Substrate structure | | | | | | | | | | |
|---|---|---|---|---|---|---|---|---|---|---|---|
| | | Inside insulating layer | | | | Outside insulating layer | | | | | |
| | Substrate thickness (mm) | Inner layer thickness (mm) | Internal filler | Filler amount (vol. %) | Linear expansion coefficient α of glass ceramic layer (ppm/° C.) | Outside layer thickness (mm) (Total top and bottom) | External filler | Filler amount (volume %) | Linear expansion coefficient α of glass ceramic layer (ppm/° C.) | Via conductor ratio (%) | Degree of flatness (μm) | Substrate strength (N) |
| Embodiment 10 | 0.2 | 0.15 | Irregularly shaped alumina B | 33 | 6.5 | 0.04 | Tabular alumina B | 22 | 6.2 | 60 | 6.3 | 4.1 |
| Comparative example 10 | 0.2 | 0.16 | Irregularly shaped alumina B | 33 | 6.5 | 0.04 | Irregularly shaped alumina B | 33 | 6.5 | 60 | 5.9 | 3.6 |
| Comparative example 11 | 0.2 | 0.15 | Tabular alumina B | 22 | 6.2 | 0.04 | Tabular alumina B | 25 | 6.2 | 60 | 14.2 | 4.0 |

As can be seen from Table 3, similar results to the results indicated in Table 2 were obtained even for a case in which the substrate was thin.

Embodiments 20 and 21

As indicated in Table 4, glass ceramic wiring substrates were fabricated using the same method as in embodiment 1, except that substrates having a via conductor ratio of 40% and 50% were used.

Comparative Examples 20 and 21

As indicated in Table 4, glass ceramic wiring substrates were fabricated using the same method as in embodiments 20 and 21, except that the tabular alumina filler A in Table 1 was used as both the external filler and the internal filler, and the amount of filler was unified to 30% by volume in each case.

Embodiments 22 to 24

Glass ceramic multilayer wiring substrates were fabricated using the same method as in embodiment 1, except that glass powder (diopside crystal glass having $SiO_2$, CaO, MgO as the main components) was used, the tabular alumina larly shaped alumina filler A in Table 1 was used as both the external filler and the internal filler, and the amount of filler was unified to 28% by volume in each case.

Comparative Example 23

A glass ceramic wiring substrate was fabricated using the same method as in embodiment 22, except that the tabular alumina filler B in Table 1 was used as both the external filler and the internal filler, and the amount of filler was unified to 20% by volume in each case.

The substrate flatness and strength were evaluated for the glass ceramic multilayer wiring substrates obtained in this way. The results are indicated in Table 4.

TABLE 4

| | Substrate structure | | | | | | | | | | |
|---|---|---|---|---|---|---|---|---|---|---|---|
| | | Inside insulating layer | | | | Outside insulating layer | | | | | |
| | Substrate thickness (mm) | Inner layer thickness (mm) | Internal filler | Filler amount (vol. %) | Linear expansion coefficient α of glass ceramic layer (ppm/° C.) | Outside layer thickness (mm) (Total top and bottom) | External filler | Filler amount (volume %) | Linear expansion coefficient α of glass ceramic layer (ppm/° C.) | Via conductor ratio (%) | Degree of flatness (μm) | Substrate strength (N) |
| Embodiment 20 | 0.4 | 0.32 | Irregularly shaped alumina A | 30 | 6.4 | 0.06 | Tabular alumina A | 23 | 6.2 | 40 | 6.5 | 15.5 |
| Comparative example 20 | 0.4 | 0.32 | Tabular alumina A | 30 | 6.4 | 0.06 | Tabular alumina A | 30 | 6.4 | 40 | 18.2 | 15.1 |
| Embodiment 21 | 0.4 | 0.32 | Irregularly shaped alumina A | 30 | 6.4 | 0.06 | Tabular alumina A | 23 | 6.2 | 50 | 8.2 | 15.3 |
| Comparative example 21 | 0.4 | 0.32 | Tabular alumina A | 30 | 6.4 | 0.06 | Tabular alumina A | 30 | 6.4 | 50 | 19.5 | 15.1 |
| Embodiment 22 | 0.4 | 0.32 | Irregularly shaped alumina A | 28 | 7.3 | 0.08 | Tabular alumina B | 20 | 7.1 | 70 | 6.7 | 19.8 |
| Embodiment 23 | 0.4 | 0.32 | Irregularly shaped alumina A | 28 | 7.3 | 0.08 | Tabular alumina B | 20 | 7.1 | 90 | 8.0 | 19.2 |
| Embodiment 24 | 0.4 | 0.32 | Irregularly shaped alumina A | 28 | 7.3 | 0.08 | Tabular alumina B | 23 | 7.2 | 70 | 6.7 | 19.3 |
| Comparative example 22 | 0.4 | 0.32 | Irregularly shaped alumina A | 28 | 7.3 | 0.08 | Irregularly shaped alumina A | 28 | 7.3 | 70 | 6.7 | 15.9 |
| Comparative example 23 | 0.4 | 0.32 | Tabular alumina B | 20 | 7.1 | 0.08 | Tabular alumina B | 20 | 7.1 | 70 | 18.7 | 19.3 | filler B indicated in Table 1 were used as the external filler, and the amounts of added filler and the via conductor ratio were varied.

Comparative Example 22

A glass ceramic wiring substrate was fabricated using the same method as in embodiment 22, except that the irregu-

Evaluation 3

As can be seen from Table 4, it was confirmed that similar effects to those in the embodiments discussed hereinabove could be obtained even if glass having a different composition was used, and it could thus be confirmed that the technique does not depend on the glass material.

According to the present invention, it is possible to provide a glass ceramic multilayer wiring substrate which has excellent substrate strength, with which various electronic components such as ICs can be mounted in a stable manner, and which is suitable for thin substrates which handle various low-profile modules.

The invention claimed is:

1. A multilayer wiring substrate comprising:
   a plurality of insulating layers, each insulating layer comprising a glass ceramic;
   a plurality of internal conductor layers formed between the insulating layers;
   via conductors that penetrate through the insulating layers and that mutually connect the internal conductor layers in different layer locations; and
   surface conductor layers formed on an outer surfaces in a lamination direction of the insulating layers;
   wherein the insulating layers within a range of a predetermined thickness from the outer surface on which the surface conductor layer is formed are defined as outside insulating layers and the insulating layers located inward of the outside insulating layers are defined as inside insulating layers;
   wherein a first aspect ratio representing an oblateness and sphericity of an external filler contained in the outside insulating layers is larger than a second aspect ratio representing an oblateness and sphericity of an internal filler contained in the inside insulating layers; and
   wherein a thermal expansion coefficient of the outside insulating layers is smaller than a thermal expansion coefficient of the inside insulating layers.

2. The multilayer wiring substrate as claimed in claim 1, wherein a total thickness of the outside insulating layers is 5 to 20% of the total thickness of the multilayer wiring substrate.

3. The multilayer wiring substrate as claimed in claim 1, wherein a via conductor ratio, defined as a value obtained by dividing the length of a longest via conductor in the direction of thickness in the multilayer wiring substrate by the total thickness of the multilayer wiring substrate, is equal to or greater than 0.4.

4. The multilayer wiring substrate as claimed in claim 1, wherein the second aspect ratio is less than or equal to 2.

5. The multilayer wiring substrate as claimed in claim 4, wherein the first aspect ratio is greater than or equal to 25.

6. The multilayer wiring substrate as claimed in claim 5, wherein a mean particle size of the external filler is larger than a mean particle size of the internal filler.

7. The multilayer wiring substrate as claimed in claim 1, wherein the first aspect ratio is greater than or equal to 25.

8. The multilayer wiring substrate as claimed in claim 1, wherein the external filler comprises alumina.

9. The multilayer wiring substrate as claimed in claim 8, wherein the external filler consists of alumina.

10. The multilayer wiring substrate as claimed in claim 1, wherein a mean particle size of the external filler is larger than a mean particle size of the internal filler.

11. The multilayer wiring substrate as claimed in claim 1, wherein a glass in the glass ceramic constituting the outside insulating layers and a glass in the glass ceramic constituting the inside insulating layers have the same composition.

12. The substrate as claimed in claim 1, wherein a total thickness of the outside insulating layers is 5 to 20% of a total thickness of the multilayer wiring substrate; and
    wherein a via conductor ratio, defined as a value obtained by dividing the length of a longest via conductor in the direction of thickness in the multilayer wiring substrate by the total thickness of the multilayer wiring substrate, is equal to or greater than 0.4.

13. The multilayer wiring substrate as claimed in claim 12, wherein the second aspect ratio is less than or equal to 2 and wherein the first aspect ratio is greater than or equal to 25.

14. The multilayer wiring substrate as claimed in claim 13, wherein the external filler comprises alumina.

15. The multilayer wiring substrate as claimed in claim 14, wherein a mean particle size of the external filler is larger than a mean particle size of the internal filler.

16. The multilayer wiring substrate as claimed in claim 15, wherein a glass in the glass ceramic constituting the outside insulating layers and a glass in the glass ceramic constituting the inside insulating layers have the same composition.

* * * * *